Dec. 22, 1970 ZENITI KIYASU ET AL 3,550,116

ANALOG TO DIGITAL CONVERTER CODER

Filed Oct. 30, 1967 8 Sheets-Sheet 1

Dec. 22, 1970 ZENITI KIYASU ET AL 3,550,116

ANALOG TO DIGITAL CONVERTER CODER

Filed Oct. 30, 1967 8 Sheets-Sheet 2

3,550,116
ANALOG TO DIGITAL CONVERTER CODER

Zeniti Kiyasu and Tetsuya Miki, Sendal-shi, and Masao Kawashima, Yokohama-shi, Japan, assignors to Fujitsu Limited, Kawasaki, Japan, a corporation of Japan Filed Oct. 30, 1967, Ser. No. 678,997
Claims priority, application Japan, Nov. 4, 1966, 41/72,712
Int. Cl. H03k 13/02
U.S. Cl. 340—347 9 Claims

ABSTRACT OF THE DISCLOSURE

A comparator compares an input analog signal with a reference signal and provides an output signal determined by the level of the input signal relative to the reference signal. A pulse generator shapes the waveshape of the output signal of the comparator and provides a digital output signal. A bias voltage circuit provides positive and negative bias voltage signals corresponding to the output signal of the comparator. A delay delays the input signal so that it is in phase with the bias voltage signals. A summing amplifier adds the bias voltage signals and the delayed input signal to provide a resultant signal. An amplifier amplifies the resultant signal.

DESCRIPTION OF THE INVENTION

The present invention relates to an analog to digital converter coder. More particularly, the invention relates to a coder for analog to digital conversion in a pulse code modulator communication system or a telemetering system.

Known coders for analog to digital conversion include the sequential comparison feedback type, the counter type, the electron tube type and the travelling wave type. Of these types, those best suited for high speed and high precision coding are the electron tube and travelling wave types. However, since electron beams are utilized in an electron tube in the electron tube type, such type requires a hot cathode for radiating thermions, a high voltage power source for accelerating electrons and extremely high precision mechanical processing. The electron tube type coder is therefore expensive, has a short life and is very difficult to reduce in size. Thus, semiconductorr arrangements such as integrated circuits, are utilized in high speed and high precision coders.

A travelling wave type coder comprises a determined number of stages of standard unit circuits having a determined input-output characteristics and connected in a determined circuit arrangement. The standard unit circuits have code output terminals at which they provide code outputs which correspond to the input signals. Although binary and reflected binary code is utilized in a conventional cascade system coder, reflected binary code is preferable in high speed and high precision systems. The standard unit for providing a reflected binary code, however, must provide full-wave rectification. In high precision coding, however, it is necessary to provide full-wave rectification of analog pulses on waveshapes which are very nearly ideally linear. Although semiconductor diodes are utilized as the rectifier elements, such diodes do not function as ideal rectifiers in small voltage ranges, so that it is extremely difficult to provide a coding function at high speed and a precision as high as 9 or 10 bits with a travelling wave type coder, since the rectifying characteristic curve of the diode, the bandwidth and gain of the amplifier and the stability of the components are unsatisfactory.

A binary coder utilizes an amplitude comparator. The output of the comparator and of a local decoder are controlled by complex logic circuits, so that the conventional binary coder does not operate at high speed and high precision.

The principal object of the present invention is to provide a new and improved analog to digital converter coder. The analog to digital converter coder of the present invention avoids the disadvantages of the coders of the prior art. The analog to digital converter coder of the present invention operates with high speed and high precision and with efficiency, effectiveness and reliability. The analog to digital converter coder of the present invention obviates the need for complex logic circuits or for a converter for converting alternating binary code into binary code. The analog to digital converter coder of the present invention may be utilized in binary, ternary, quaternary and other multinary coders with the same high speed and precision.

Contrary to the travelling wave type reflected binary coder, in which there is full-wave rectification of the analog signal pulse, the analog to digital converter coder of the present invention provides binary coding by inverting the polarity of the bias voltage corresponding to the sign or polarity of the analog input signal pulse and adding said bias voltage to said input signal pulse. The polarity of the bias voltage may be inverted and said voltage may be added to the input signal pulse by any suitable known arrangement comparable to full-wave rectification. Therefore, binary coding in accordance with the present invention is best suited for a travelling wave type coder of high speed and high precision. The analog to digital converter coder of the present invention functions as a travelling wave type binary of multinary coder.

In accordance with the present invention, an analog to digital converter coder comprises an input source for providing an input analog signal. A reference source provides a reference signal. A comparator has an output and inputs connected to the input source and the reference source for comparing the input signal with the reference signal. The comparator provides an output signal determined by the level of input signal relative to the reference signal. A pulse generator has an input connected to the output of the comparator and an output for shaping the waveshape of the output signal of the comparator. A code output is connected to the output of the pulse generator and provides a digital output signal. A bias voltage source has an input connected to the output of the comparator and an output for providing positive and negative bias voltage signals corresponding to the output signal of the comparator. A delay device has an input connected to the input source and an output for delaying the input signal so that the input signal is in phase with the bias voltage signals. A summing circuit has an input connected to the output of the bias voltage source, an input connected to the output of the delay device and an output for adding the bias voltage signals and the delayed input signal to provide a resultant signal. If desired, an amplifier may be provided with an input connected to the output of the summing circuit and an output for amplifying the resultant signal provided by the summing circuit.

The bias voltage source may comprise a bistable multivibrator having an input connected to the output of the comparator and an output, to a source of positive and negative bias voltages having an input connected to the output of the bistable multivibrator, and an output connected to the input of the summing circuit. The bistable multivibrator selectively switches the positive and negative bias voltages. The bias voltage source may comprise a source of positive bias voltage, a source of negative bias voltage and an electromagnetic relay having a switch arm connected to the source of positive bias voltage, a switch arm connected to the source of negative bias voltage and an energizing winding in operative proximity with the switch arms for controlling the positions of the switch arms to selectively switch the sources of positive and negative bias voltage, the energizing winding being connected to the output of the comparator. The amplifier preferably has a gain which privides the coder with an overall gain of 2. The positive bias voltage is preferably $+Vm/2$ and the negative bias voltage is $-Vm/2$, wherein V$m$ is the overload voltage of the coder.

In another embodiment of the present invention, an input source provides an input analog signal. A saturation amplifier has an input connected to the input source and an output for providing positive and negative saturated output signals corresponding to the input signal. A pulse generator has an input connected to the output of the saturation amplifier and an output for shaping the waveshape of the output signal of the saturation amplifier. A code output is connected to the output of the pulse generator and provides a digital output signal. A delay device has an input connected to the input source and an output for delaying the input signal so that the input signal is in phase with the output sginal of the saturation amplifier. A summing circuit has an input connected to the output of the saturation amplifier, an input connected to the output of the delay device and an output for adding the output signal of the saturation amplifier and the delayed input signal to provide a resultant signal. If desired, an amplifier is provided having an input connected to the output of the summing circuit and an output for amplifying the resultant signal provided by the summing circuit. The saturation amplifier preferably has a saturation level of $+Vm/2$ and a saturation level of $-Vm/2$, wherein V$m$ is the overload voltage of the coder. The saturation amplifier preferably comprises a phase inverting amplifier and the amplifier comprises a non-phase inverting amplifier, or else the saturation amplifier comprises a non-phase inverting amplifier and the amplifier comprises a phase inverting amplifier. The amplifier preferably has a gain of 2.

In another embodiment of the present invention, the analog to digital converter coder comprises an input source for providing an input analog signal, a reference source provides different first and second reference signals, a plurality of comparators each has an output and inputs connected to the input source and the reference source for comparing the input signal with one of the reference signals. Each of the comparators provides an output signal determined by the level of the input signals relative to the corresponding one of the reference signals. A plurality of pulse generators each has an input connected to the output of a corresponding one of the comparators and an output for shaping the waveshape of the output signal of the corresponding one of the comparators. Each of a plurality of code outputs is connected to the output of a corresponding one of the pulse generators for providing a digital output signal. A plurality of bias voltage sources each has an input connected to the output of the corresponding one of the comparators and an output for providing positive and negative bias voltage signals corresponding to the output signal of the corresponding one of the comparators. A delay device has an input connected to the input source and an output for delaying the input signal so that the input signal is in phase with the bias voltage signals. A summing circuit has inputs connected to the outputs of each of the bias voltage sources, an input connected to the output of the delay device and an output for adding the bias voltage signals and the delayed input signal to provide a resultant signal. If desired, an amplifier may be provided having an input connected to the output of the summing circuit and an output for amplifying the resultant signal provided by the summing circuit. The amplifier preferably has a gain of greater than 3.

In accordance with the present invention, a method of converting from analog to digital code comprises inverting the polarity of a bias voltage in accordance with the polarity of an input analog signal and adding the bias voltage to the input analog signal. In order that the present invention may be readily carried into effect, it will now be described with reference to the accompanying drawings wherein.

Figure 1:
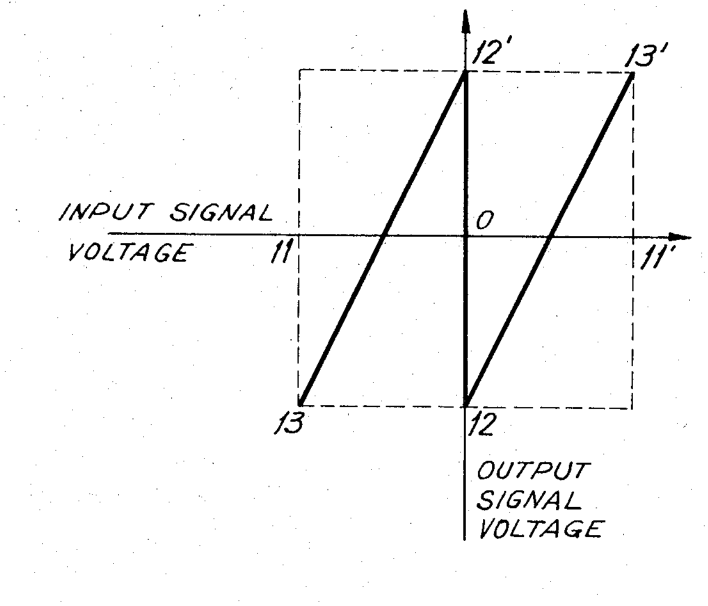
FIGS. 1 and 2 are graphical presentations of the input signal voltage versus output signal voltage of the analog to digital converter coder of the present invention.

FIG. 1 illustrates the input-output characteristic of the analog to digital converter coder of the present invention for providing a usual, common or natural binary coder, hereinafter referred to merely as binary code. In FIG. 1, the abscissa 11–11′ represents the input signal voltage and the ordinate 12–12′ represents the output signal voltage. The overload voltage of the coder is indicated as ±V$m$, and the intersection of the abscissa and ordinate indicates zero volts.

Figure 11:
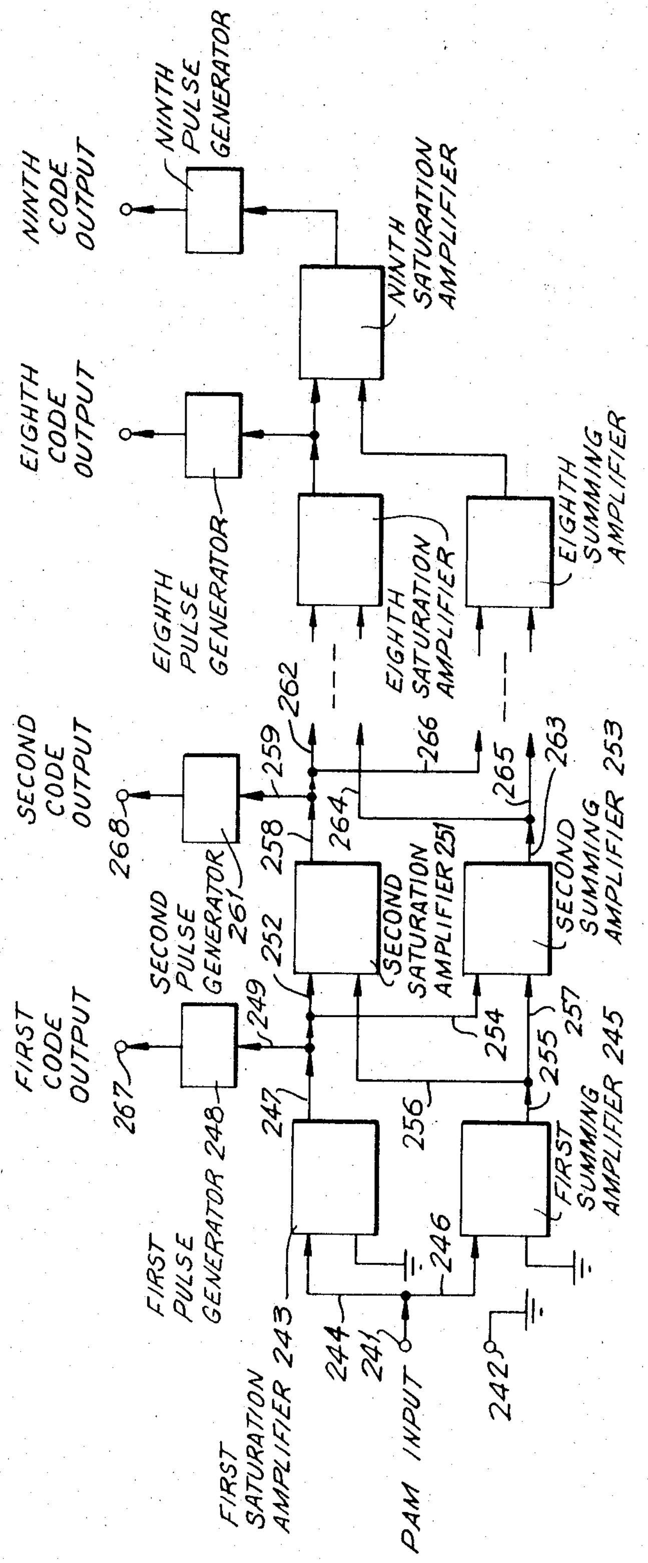
FIG. 11 is a block diagram of another embodiment of the analog to digital converter coder of the present invention.
Figure 12:
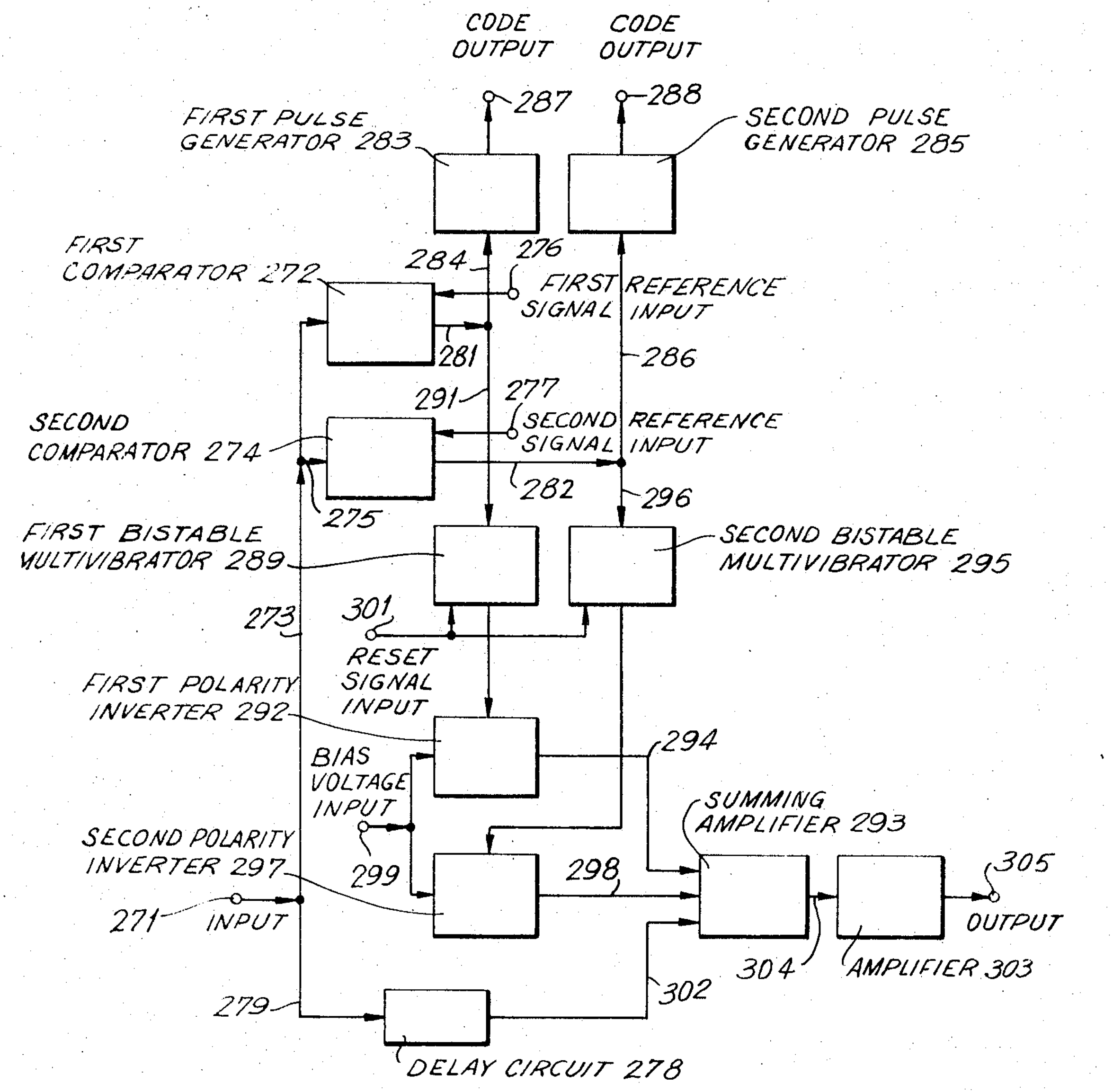
FIG. 12 is a block diagram of still another embodiment of the analog to digital converter of the present invention.

In FIG. 1, 11 and 12 each indicate a negative voltage of −V$m$ volts and 11′ and 12′ each indicate a positive voltage of +V$m$ volts. The input-output characteristic is indicated by 13, 12′, 12, 13′. The analog to digital converter coder must not only have the input-output characteristic illustrated, but must also provide a digital code output of 1 when the analog input signal is within the range of 0 to 11′, that is of positive polarity, and must provide a digital code output of 0 when the analog input signal is within the range of 0 to 11, that is of negative polarity.

Figure 2:
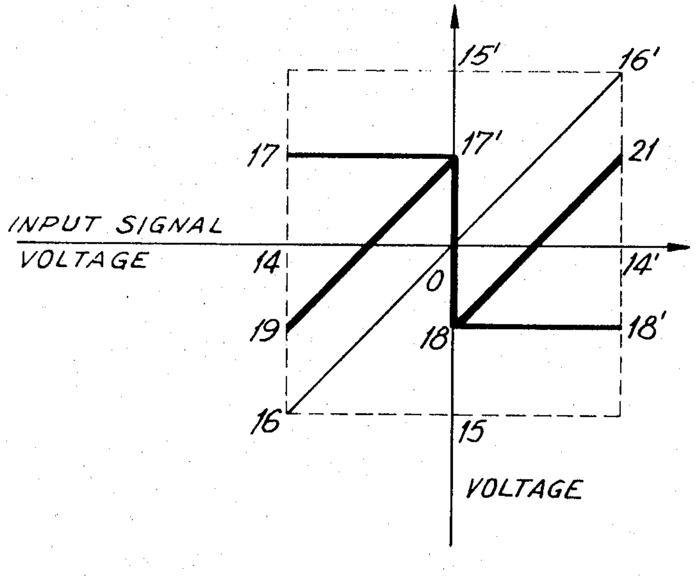

FIG. 2 illustrates how the input-output characteristic of FIG. 1 is derived. In FIG. 2, the abscissa 14–14′ represents the input signal voltage and the ordinate 15–15′ represents the voltage. In FIG. 2, as in FIG. 1, the intersection of the abscissa and ordinate indicates 0 volts; 14 and 15 indicate negative charges of −V$m$ volts and 14′ and 15′ represent positive voltages of +V$m$ volts. The midpoint 18 of the voltage 0–15 indicates a negative voltage of $-Vm/2$ volts. The midpoint 17′ of the voltage 0–15 indicates a voltage of $+Vm/2$ volts.

If it is assumed that a voltage source is provided which produces a constant voltage of $+Vm/2$ volts when the input signal is within the range of 0–14, or of negative polarity, and produces a constant voltage of $-Vm/2$ volts when the input signal is within the range of 0–14′, or of positive polarity, then the output voltage characteristics of such a voltage source is illustrated by 17, 17′, 18, 18′ and the input signal voltage may be translated to the voltage of the ordinate 15–15′ by the line 16, 0, 16′. Thus, by adding the lines 17, 17′, 18, 18′ and the line 16, 0, 16′ a curve comprising the resultant lines 18, 17′, 18, 21 is provided. If the scale of the ordinate 15, 15′ is doubled, the curve of the resultant lines 9, 17′, 18, 21 is made coincident with the curve of lines 13, 12', 12, 13' of FIG. 1.

Figure 3:
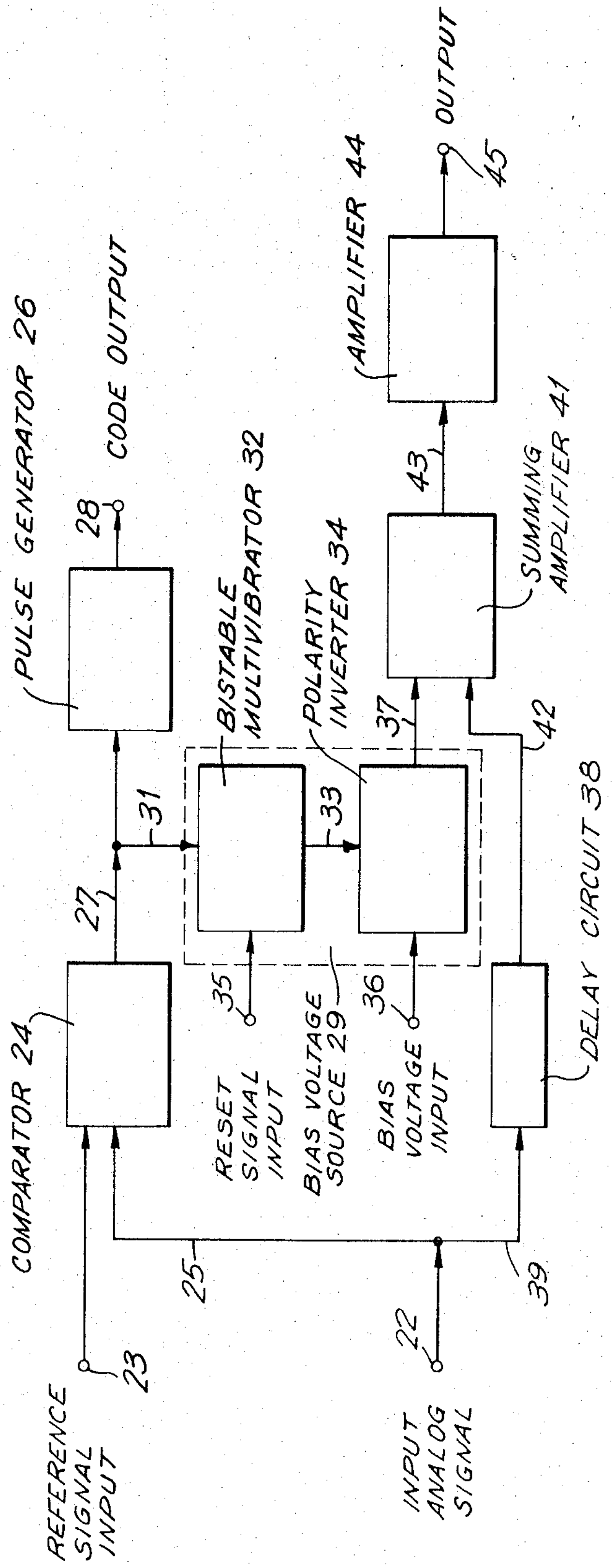
FIG. 3 is a block diagram of an embodiment of the analog to digital converter coder of the present invention.

FIG. 3 illustrates a first embodiment of the analog to digital converter coder of the present invention. An analog input signal is provided or supplied to an input terminal 22. A reference signal is supplied to a reference signal input terminal 23. The input analog signal is supplied to an input of an amplitude comparator 24 via the input terminal 22 and a lead 25. The reference signal is supplied to another input of the comparator 24 via the input terminal 23. The comparator 24 compares the input analog signal with the reference signal and provides at its output an output signal which is determined by the level of said analog input signal relative to said reference signal. The output signal of the comparator 24 is supplied to the input of a pulse generator 26 via a lead 27. The pulse generator 26 functions to shape the waveshape of the output signal of the comparator 24 and provides at its output a binary code output signal which is thus available at an output terminal 28.

The output signal of the comparator 24 is also supplied to the input of a bias voltage source 29 via the lead 27 and a lead 31. The bias voltage source 29 may comprise a bistable multivibrator 32 having an input to which the output signal of the comparator 24 is supplied, and an output which is connected via a lead 33 to the input of a polarity inverter 34. A reset signal is supplied to the bistable multivibrator 32 via an input terminal 35 and bias voltages are supplied to the polarity inverter 34 via an input terminal 36. The bias voltage source 29 functions to provide, in the output of the polarity inverter 34 and therefore in a lead 37, positive and negative bias voltage signals corresponding to the output signal of the comparator 24.

The input analog signal is also supplied to the input of a delay circuit or device 38 via a lead 39. After suitable delay in the delay circuit 38, the input analog signal is supplied to an input of a summing amplifier 41 via a lead 42. The lead 37 from the output of the polarity inverter 34 is connected to another input of the summing amplifier 41. The delay circuit 38 delays the input analog signal sufficiently so that when it is supplied to the summing amplifier 41, it is in phase with the bias voltage signals supplied by the bias voltage source 29.

The summing amplifier or summing circuit 41 adds the bias voltage signals from the bias voltage source 29 and the delayed signal from the delay circuit 38 to provide a resultant signal which is supplied via a lead 43 to the input of an amplifier 44. The amplifier 44 may be dispensed with, if desired. If included, the amplifier 44 has a gain which is sufficient to provide the converter coder of FIG. 3 with an overall gain of 2. The amplitude output signal is provided at an output terminal 45. The amplitude comparator 24 functions to determine the polarity of the input analog signal and, in accordance with such determination, produces an output signal in the lead 27 which is either positive or negative in polarity, in accordance with the polarity of said input analog signal. The pulse generator 26 produces a binary 1 code output signal when the output signal provided by the comparator 24 is of positive polarity and produces a binary 0 code output signal when the output signal provided by said comparator is of negative polarity. The bistable multivibrator 32 may comprise any suitable bistable multivibrator or flip-flop circuit and functions in the usual manner in two stable states or conditions. The bistable multivibrator 32 is triggered to its set condition when the output signal of the comparator 24 is of positive polarity, indicating a binary 1 code output signal. Just prior to the next succeeding output signal of the comparator 24, a reset signal is supplied via the input terminal 35 to the reset input of the bistable multivibrator 32 and resets said bistable multivibrator.

It is, of course, possible to trigger the bistable multivibrator to its set condition when the output signal of the comparator 24 is of negative polarity, thereby indicating a binary 0 code output signal. In such case, the polarity of the bias voltage should be inverted.

The polarity inverter 34 may comprise any suitable polarity inverter or switching circuit such as, for example, a diode switching circuit. The polarity inverter 34 may comprise a relay-operated arrangement if high precision, but not high speed is desired. A bias voltage, provided by any suitable voltage source is supplied to the polarity inverter 34 via the input terminal 36. The operation of the polarity inverter 34 is controlled by the bistable multivibrator 32. Thus, the polarity inverter 34 provides in the lead 37, an output voltage of $-Vm/2$ volts when the bistable multivibrator is in its set condition and provides in said lead, an output signal of $+Vm/2$ volts when said bistable multivibrator is in its reset condition.

The bias voltage source 29 may comprise a relay arrangement instead of the bistable multivibrator 32. In such case, the bias voltage source 29 may comprise a source of positive bias voltage, a source of negative bias voltage and an electromagnetic relay. The electromagnetic relay has a switch arm connected to the source of positive bias voltage and a switch arm connected to the source of negative bias voltage. The electromagnetic relay comprises an energizing winding in operative proximity with the switch arms, which functions to control the positions of said switch arms to selectively switch the source of positive and negative bias voltage. In such case, the energizing winding of the electromagnetic relay is connected to the output of the comparator 24.

In the embodiment of FIG. 3, the comparator 24 and the bias voltage source 29 function to produce the voltage characteristic 17, 17', 18, 18' of FIG. 3. The output signal provided by the comparator 24 and the bias voltage source 29 in the lead 37 has a voltage of $-Vm/2$ volts or $+Vm/2$ volts in accordance with whether the output signal of said comparator is positive or negative in polarity. The addition of the time delayed input analog signal provided by the delay circuit 38 and the signal provided by the comparator 24 and the bias voltage source 29 produces a resultant curve 19, 17', 18, 21, as illustrated in FIG. 2. The resultant curve 19, 17', 18, 21 (FIG. 2) is thus produced by the summing amplifier 21 and appears in the lead 43.

In order to convert the voltage characteristic of FIG. 2 into the input-output characteristic of FIG. 1, it is necessary to double the characteristic of FIG. 2. The characteristic of FIG. 2 is doubled in amplification, for such purpose, by the amplifier 44. The doubled characteristic is provided at the output terminal 45. It is necessary, in order to attain such result, that the total gain of the summing amplifier 41 and the amplifier 44 be 2.

A comparison of the precision obtained with the analog to digital converter coder of the present invention and with a conventional travelling wave type coder of alternating binary code indicates the superiority of the coder of the present invention. It is difficult to provide high precision with the conventional travelling wave type coder due to the non-linear characteristic of the diode and the additional capacity in the full-wave rectification of the input analog signal. In the analog to digital converter coder of the present invention, however, high precision is provided since such precision is determined by the bias voltage and the polarity inverter. A suitable arrangement for providing high precision thus utilizes a Zener diode in a constant temperature bath as the source of bias voltage. Such a source of bias voltage is highly stable. Even if there is a non-linear distortion in the switching element, regarding the switching of the polarity inverter, the bias voltage is constant so that such distortion may be compensated and extremely high precision is provided. With regard to operation at high speed, the coding speed is decreased by the bandwidth of the amplifier if said amplifier has a gain of 2. However, in the coder of the present invention the overall gain is 2 so that there is no decrease in gain. Extremely high speed coding operation may be provided if an ultra broad-band transistorized travelling wave amplifier or a negative resistance amplifier is utilized.

Figure 4:
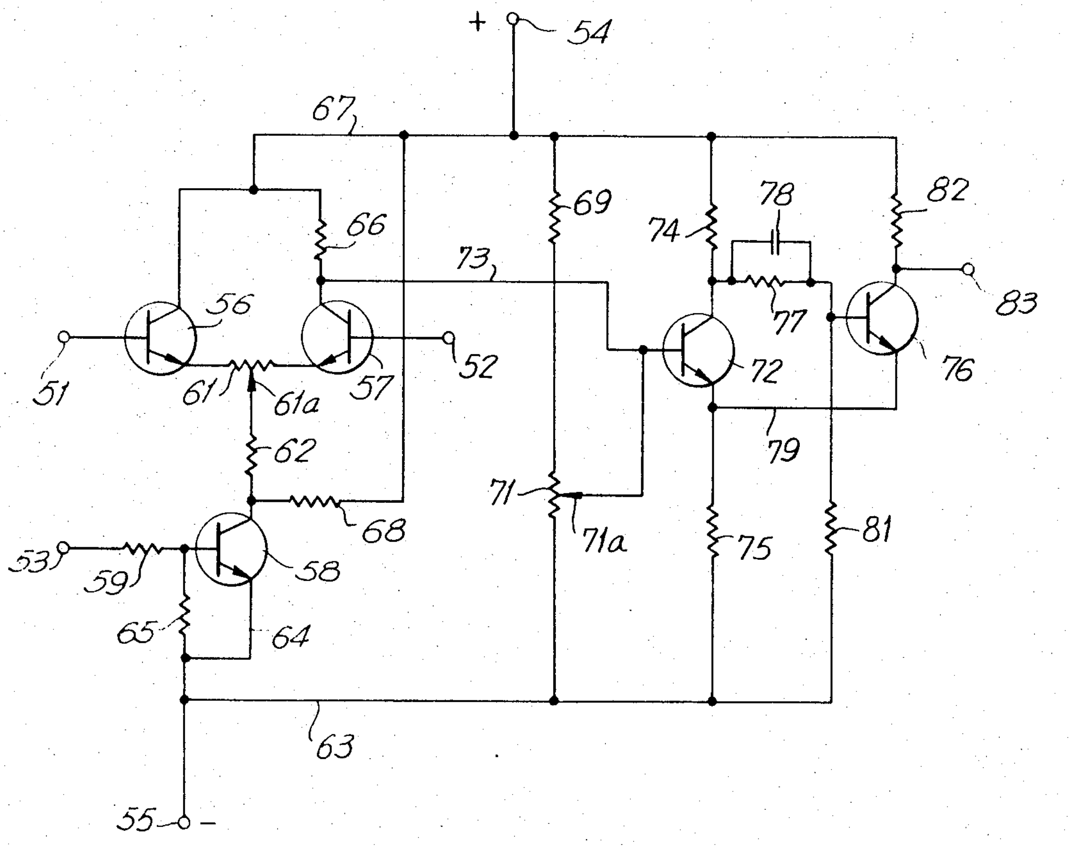
FIG. 4 is a circuit diagram of a comparator which may be utilized in the embodiment of FIG. 3.

FIG. 4 illustrates an amplitude comparator which may be utilized as the comparator 24 of the embodiment of FIG. 3. In FIG. 4, the input analog signal is supplied to an input terminal 51. The reference signal is supplied to an input terminal 52. A clock pulse is supplied to an input terminal 53. The comparator is suitably energized by a positive bias voltage supplied by any suitable DC voltage source and applied to an input terminal 54 and by a negative bias voltage supplied by any suitable DC source and applied to the input terminal 55. The input terminal 51 is connected to the base electrode of a first transistor 56. The input terminal 52 is connected to the base electrode of a second transistor 57. The input terminal 53 is connected to the base electrode of a third transistor 58 via a resistor 59. The emitter electrodes of the first and second transistors are connected to each other via a variable resistor 61. The movable terminal 61*a* of the variable resistor 61 is connected to the collector electrode of the third transistor 58 via a resistor 62.

The emitter electrode of third transistor 58 is connected to a negative voltage lead 63 via a lead 64 which shunts a resistor 65 connected to the base electrode thereof. The collector electrodes of the first and second transistors 56 and 57 are connected to each other via a resistor 66. A common point on the connection between the collector electrodes of the first and second transistors 56 and 57, intermediate the resistor 66 and the collector electrodes of the first transistor, is connected to a positive voltage lead 67. The collector electrode of the third transistor 58 is connected to the positive voltage lead 67 via a resistor 68. A voltage divider is connected between the positive voltage lead 67 and the negative voltage lead 63 and comprises a resistor 69 and a variable resistor 71 connected in series between said leads 67 and 63. The movable terminal 71*a* of the variable resistor 71 is connected to the base electrode of a fourth transistor 72.

The collector electrode of the second transistor 57 is connected to the base electrode of the fourth transistor 72 via a lead 73. The collector electrode of the fourth transistor 72 is connected to the positive voltage lead 67 via a resistor 74. The emitter electrode of the fourth transistor 72 is connected to the negative voltage lead 63 via a resistor 75. The collector electrode of the fourth transistor 72 is connected to the base electrode of the fifth transistor 76 via a lead 77 which is shunted by a capacitor 78. The emitter electrodes of the fourth to fifth transistors 72 and 76 are connected to each other via a lead 79. The base electrode of the fifth transistor 76 is connected to the negative voltage lead 63 via a resistor 81. The collector electrode of the fifth transistor 76 is connected to the positive voltage lead 67 via a resistor 82. The output signal of the comparator is provided at an output terminal 83 which is connected to the collector electrode of the fifth transistor 76.

Each of the first to fifth transistors in the embodiment of FIG. 4 is of NPN type transistor. The circuit including the first, second and third transistors 56, 57 and 58 and their interconnecting components functions as a differential amplifier. The circuit comprising the fourth and fifth transistors 72 and 76 and their interconnecting components functions as a Schmitt trigger circuit. The comparator circuit of FIG. 4 functions to compare the amplitude or level of the input analog signal supplied to the input terminal 51 with the amplitude or level of the reference signal supplied to the input terminal 52. The positive or negative signal indicating the result of the comparison is supplied to the base electrode of the fourth transistor 72 of the Schmitt trigger circuit. The Schmitt trigger circuit provides pulses of either constant amplitude or non-constant amplitude dependent upon the polarity of the signal provided by the differential amplifier.

Figure 5:
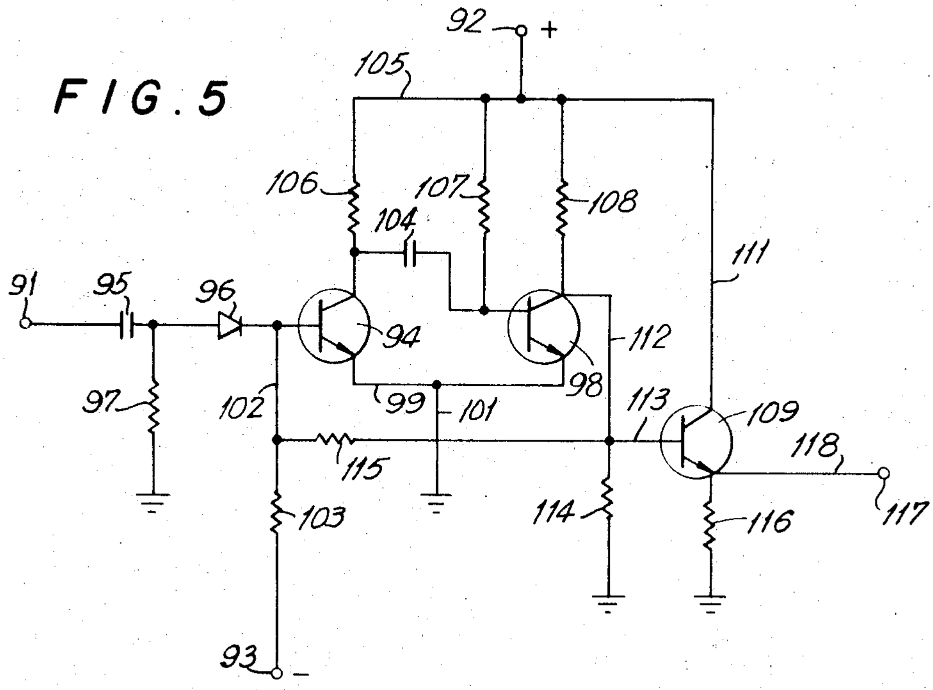
FIG. 5 is a circuit diagram of a pulse generator which may be utilized in the embodiment of FIG. 3.

FIG. 5 illustrates a pulse generator which may be utilized as the pulse generator 26 of the embodiment of FIG. 3. In FIG. 5, the output signal of the comparator 24 is supplied to an input terminal 91. The pulse generator is operated by a positive bias voltage supplied to an input terminal 92 and a negative bias voltage supplied to an input terminal 93. Each of the positive and negative bias voltages may be supplied by any suitable source of DC voltage. The input terminal 91 is coupled to the base electrode of a first transistor 94 via a capacitor 95 and a diode 96 connected in series with each other. A resistor 97 is connected between a common point in the connection between the capacitor 95 and the diode 96 and a point at ground potential. The emitter electrode of the first transistor 94 and the emitter electrode of the second transistor 98 are connected to each other via a lead 99 which is connected to a point at ground potential via a lead 101. The base electrode of the first transistor 94 is connected to the terminal 93 via a lead 102 and a resistor 103. The collector electrode of the first transistor 94 is connected to the base electrode of the second transistor 98 via a capacitor 104. The collector electrode of the first transistor 94 is connected to a positive voltage lead 105 via a resistor 106. The base electrode of the second transistor 98 is connected to the positive voltage lead 105 via a resistor 107. The collector electrode of the second transistor 98 is connected to the positive voltage lead 105 via a resistor 108. The collector electrode of a third transistor 109 is connected to the positive voltage lead 105 via a lead 111.

The collector electrode of the second transistor 98 is connected to the base electrode of the third transistor 109 via a lead 112 and a lead 113. The collector electrode of the second transistor 98 is connected to a point at ground potential via the lead 112 and a resistor 114. The base electrode of the third transistor 109 is connected to the input terminal 93 via the lead 113, a resistor 115 and the resistor 103. The emitter electrode of the third transistor 109 is connected to a point at ground potential via a resistor 116 and to an output terminal 117 via a lead 118.

In the embodiment of FIG. 5, each of the first, second and third transistors comprises an NPN transistor. The capacitor 95 and the resistor 97 function as a differentiation circuit and provide a positive trigger pulse which is supplied to the base electrode of the first transistor 94 via the diode 96. The first and second transistors 94 and 98 and their connecting components function as a monostable multivibrator. The monostable multivibrator produces a non-distorted output pulse due to the trigger pulse supplied to the base electrodes of the first transistor 94. The third transistor 109 and the resistor 116 function as an emitter follower which provides pulses suitable for transmission. The emitter follower may, if desired, be omitted.

Figure 6:
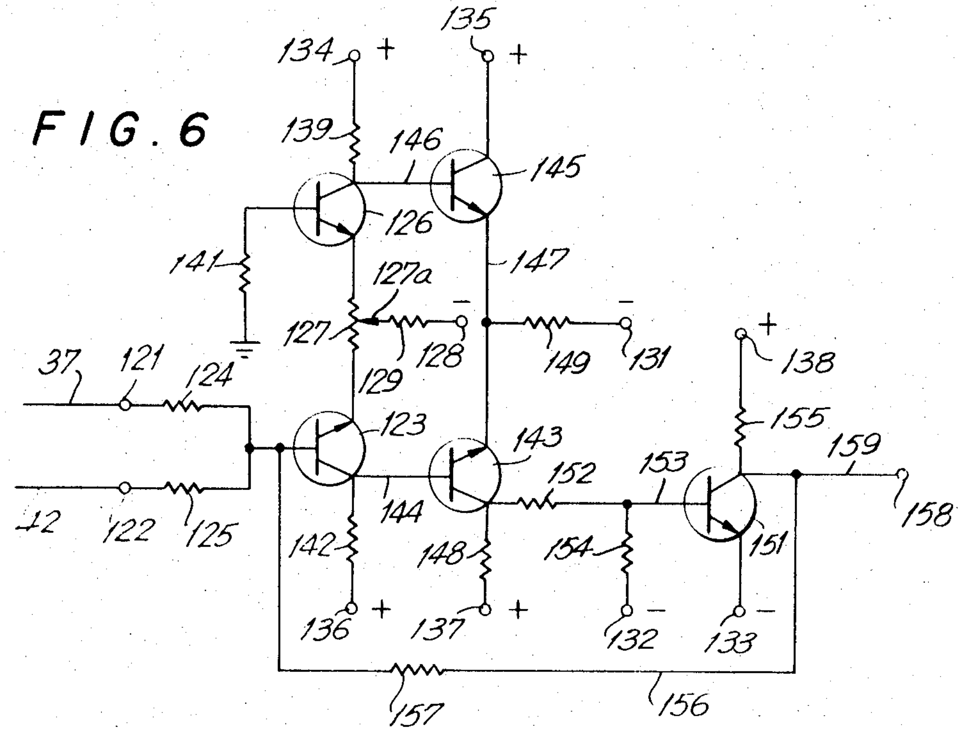
FIG. 6 is a circuit diagram of a summing amplifier which may be utilized in the embodiment of FIG. 3.

FIG. 6 suggests a summing amplifier which may be utilized as the summing amplifier 41 of the embodiment of FIG. 3. In FIG. 6, the lead 37 of the embodiment of FIG. 3 is connected to an input terminal 121 and the lead 42 of the embodiment of FIG. 3 is connected to an input terminal 122. The input terminals 121 and 122 are connected in common to the base electrode of a first transistor 123. The input terminal 121 is connected to the base electrode of the first transistor 123 via a resistor 124, and the input terminal 122 is connected to said base electrode via a resistor 125. The emitter electrode of a second transistor 126 and the emitter electrode of the first transistor 123 are connected to each other via a variable resistor 127. The movable terminal 127*a* of the variable resistor 127 is connected to an input terminal 128 via a resistor 129.

The summing amplifier is operated by negative bias voltages applied to the input terminal 128 and to input terminals 131, 132 and 133, as well as positive bias voltages applied to input terminals 134, 135, 136, 137 and 138. The bias voltages are provided by any suitable sources of DC voltage. The collector electrode of the second transistor 26 is connected to the input terminal 134 via a resistor 139. The base electrode of the second transistor 126 is connected to a point at ground potential via a resistor 141. The collector electrode of the first transistor 123 is connected to the input terminal 136 via a resistor 142.

The collector electrode of the first transistor 123 is connected to the base electrode of a third transistor 143 via a lead 144. The collector electrode of the second transistor 126 is connected to the base electrode of a fourth transistor 145 via a lead 146. The emitter electrodes of the third and fourth transistors 143 and 145 are connected to each other via a lead 147. The collector electrode of the fourth transistor 145 is connected to the input terminal 135. The collector electrode of the third transistor 143 is connected to the input terminal 137 via a resistor 148. A common point in the lead 147 connecting the emitter electrodes of the third and fourth transistors 143 and 145 is connected to the input terminal 131 via a resistor 149.

The collector electrode of the third transistor 143 is connected to the base electrode of a fifth transistor 151 via a resistor 152 and a lead 153. The base electrode of the fifth transistor 151 is connected to the input terminal 132 via a resistor 154. The emitter electrode of the fifth transistor 151 is connected to the input terminal 133. The collector electrode of the fifth transistor 151 is connected to the input terminal 138 via a resistor 155. The collector electrode of the fifth transistor 151 is connected to the base electrode of the first transistor 123 via a feedback loop 156, which includes a resistor 157. An output terminal 158 is connected to the collector electrode of the fifth transistor 151 via a lead 159.

The amplitude or level of the bias voltage applied via the lead 37 is half that of the maximum amplitude or level. Each of the first to fifth transistors of the embodiment of FIG. 6 is cf NPN type. The first, second, third and fourth transistors 123, 126, 143 and 145, respectively, and their connecting components comprise a differential amplifier. The second, third and fifth transistors 123, 143 and 151, respectively, and the feedback resistor 157 comprise a feedback amplifier. When the voltage amplification factor $\mu$ of the feedback amplifier is sufficiently large, the resistances of the resistors 124, 125 and 157 are R1, R2 and R*f*, respectively, and the voltages of the input signals in leads 37 and 42 are V1 and V2, respectively. The output voltage VO provided at the output terminal 158 may then be expressed as follows $$VO=-Rf\left(\frac{V1}{R1}+\frac{V2}{R2}\right)$$

Although the analog to digital converter coder of the present invention is essentially as hereinbefore described with reference to FIG. 3, there may be various modifications thereof. The summing amplifier 41 ordinarily functions not only as a summing circuit, but also as an amplifier, so that a summing amplifier having a gain of 2 may be substituted for the combination of the summing amplifier 41 and the amplifier 44 (FIG. 3). The amplifier 44 may also be connected in the lead 139 between the input terminal 22 and the delay circuit 38 of FIG. 3. In this case, of course, the output terminal 45 will be directly connected to the output of the summing amplifier 41 via the lead 43 (FIG. 3). The bias voltages $-Vm$ and $+Vm$ are then applied to the input of the summing amplifier 41 via the lead 37 in accordance with the positive or negative polarity of the output singal of the comparator 24 (FIG. 3).

The amplifier 44 of FIG. 3 may be omitted, if desired. In this case, the input-output characteristic of the analog to digital converter coder of the present invention will then be the curve 19, 17′, 18, 21 of FIG. 2, and the voltage range of the output signal will then be one-half of the voltage range of the input singal. For this reason, the bias voltage must be one-half that of the preceding stage. Thus, for eaxmple, if the bias voltage of a first stage, which is the converter coder of the present invention, is 8 volts, the bias voltage of a second stage, which is also the converter coder of the present invention, must be 4 volts, and the bias voltage of the third stage, which is also the converter coder of the present invention, must be 2 volts.

The principal defect of the travelling wave type coder is that the distortion of the increasing waveform or waveshape of the pulse, due to the fact that the bandwith of the amplifier is finite, increases further in each succeeding stage, since each stage includes the distortions of all the preceding stages. This defect may be overcome by providing waveform or waveshape shaping circuits between each of the stages, each of such stages comprising the converter coder of the present invention. The waveshape shaping circuit may comprise, for example, a sampling circuit and a pulse generating circuit, which together produce waveshapes which are free from distortions by sampling waveshapes having distortion from the preceding stage.

Figure 7:
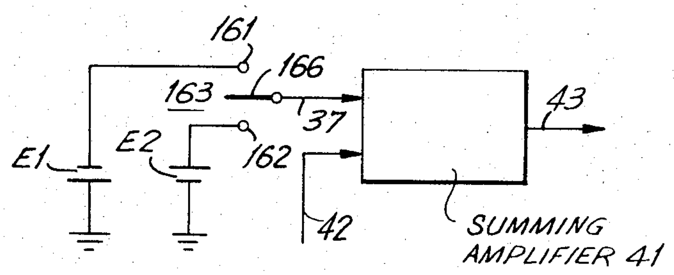
FIGS. 7 and 8 are block diagrams for explaining the operation of the polarity inverter of the embodiment of FIG. 3.
Figure 8:
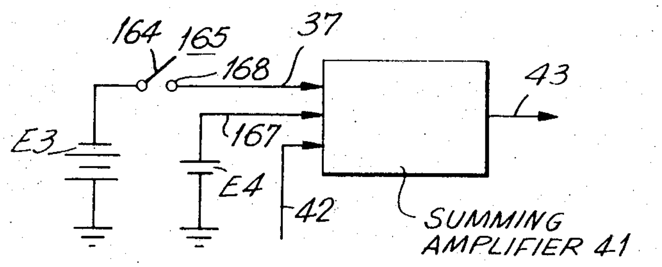

The switching circuit of the polarity inverter 34 may be provided by the arrangements of FIGS. 7 and 8. Each of FIGS. 7 and 8 illustrates the part of the embodiment of FIG. 3 comprising the bias voltage source, the polarity inevrter 34 and the summing amplifier 41 of FIG. 3, including the input leads 37 and 42 and the output lead 43. In FIG. 7, the bias voltage sources E1 and E2 are connected between points at ground potential and terminals 161 and 162, respectively, of a changeover switch 163. In FIG. 8, bias voltage sources E3 and E4 are connected between points at ground potential and a switch arm 164 of a switch 165 and an input to the summing amplifier 41, respectively.

In FIG. 7, the bias voltage source E1 provides $-Vm/2$ volts and the bias voltage source E2 provides $+Vm/2$ volts. The switch arm 166 of the changeover switch 163 is connected to the input lead 37 of the summing amplifier 41, so that the necessary bias voltage may be applied to said summing amplifier 41 by suitable movement of said switch arm. Thus, the switch arm 166 is in electrical contact with the switch terminal 161 when the bistable multivibrator 32 (FIG. 3) is in its set condition and is in electrical contact with the switch terminal 162 when said bistable multivibrator is in its reset condition.

In FIG. 8, the bias voltage source E3 provides $-Vm$ volts and the bias voltage source E4 provides $+Vm/2$ volts. The bias voltage of $+Vm/2$ volts provided by the bias voltage source E4 is continually applied to the summing amplifier 41 via a lead 167. The switch arm 164 of the switch 165 is an electrical contact with a switch terminal 168 when the bistable multivibrator 32 (FIG. 3) is in its set condition, so that the bias voltage $-Vm$ of the bias voltage source E3 is applied to the summing amplifier 41 jointly with bias voltage $+Vm/2$ of the bias voltage source E4. The resultant sum of the addition of $-Vm$ volts and $+Vm/2$ volts is $-Vm/2$ volts, so that the required small bias voltage, as provided in FIG. 7, may be applied. The circuit arrangements of FIGS. 7 and 8 may be utilized either jointly or independently in accordance with the requirements of the actual circuit utilized.

Figure 9:
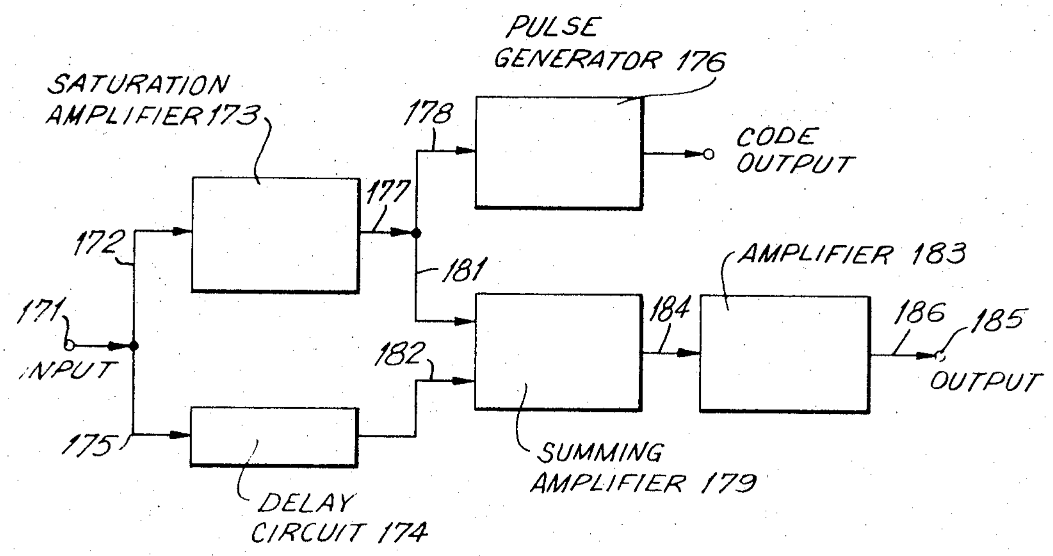
FIG. 9 is a block diagram of another embodiment of the analog to digital converter coder of the present invention.

FIG. 9 illustrates another embodiment of the analog to digital converter coder of the present invention. In FIG. 9, the input analog signal is supplied via an input terminal 171 and a lead 172 to an input of a saturation amplifier 173. The saturation amplifier 173 functions to provide positive and negative saturated output signals in accordance with the input analog signal supplied to the input terminal 171. The input analog signal is also supplied to a delay circuit 174 via a lead 175.

The saturation amplifier 173 provides at its output an output signal which is supplied to the input of a pulse generator 176 via leads 177 and 178 and which is also supplied to an input of a summing amplifier 179 via a lead 181. The output of the delay circuit 174 is supplied to another input of a summing amplifier 179 via a lead 181. The output of the summing amplifier 179 is supplied to the input of an amplifier 183 via a lead 184. An output terminal 185 is connected to the output of the amplifier 183 via a lead 186.

The delay circuit 174, the pulse generator 176, the summing amplifier 179 and the amplifier 183 are the same, and function in the same manner, as the corresponding components 38, 26, 41 and 44 of the embodiment of FIG. 3. The saturation levels of the saturation amplifier 173 are $+Vm/2$ volts and $-Vm/2$ volts, wherein $Vm$, as in the embodiment of FIG. 3, is the overload voltage of the coder. The amplifier 183 has a gain which is such that the overall gain of the converter coder of FIG. 9 is 2. The saturation amplifier 173, besides having the aforementioned saturation levels, also functions as a phase inverter. Thus, if the input analog signal supplied to the input terminal 171 is of positive polarity, the saturation amplifier 173 provides an output signal having a voltage of $-Vm/2$ volts. If the input analog signal supplied to the input terminal 171 is of negative polarity, the saturation amplifier 173 provides an output signal having a voltage of $+Vm/2$ volts. It is thus seen that the saturation amplifier 173 provides the operations provided by the comparator 24 and the bias voltage source 29 of the embodiment of FIG. 3. The output signal of the saturation amplifier 173, which is provided in the lead 177, and the delayed input analog signal, provided in the lead 182 by the delay circuit 174, are added to each other in the summing amplifier 179. The output of the summing amplifier 179 is then doubled by the amplifier 183 and is provided at the output terminal 185. Although the pulse generator 176 and the delay circuit 174 function in the same manner as the corresponding components 26 and 38 of the embodiment of FIG. 3, the total gain of the converter coder of the embodiment of FIG. 9 must be doubled.

Figure 10:
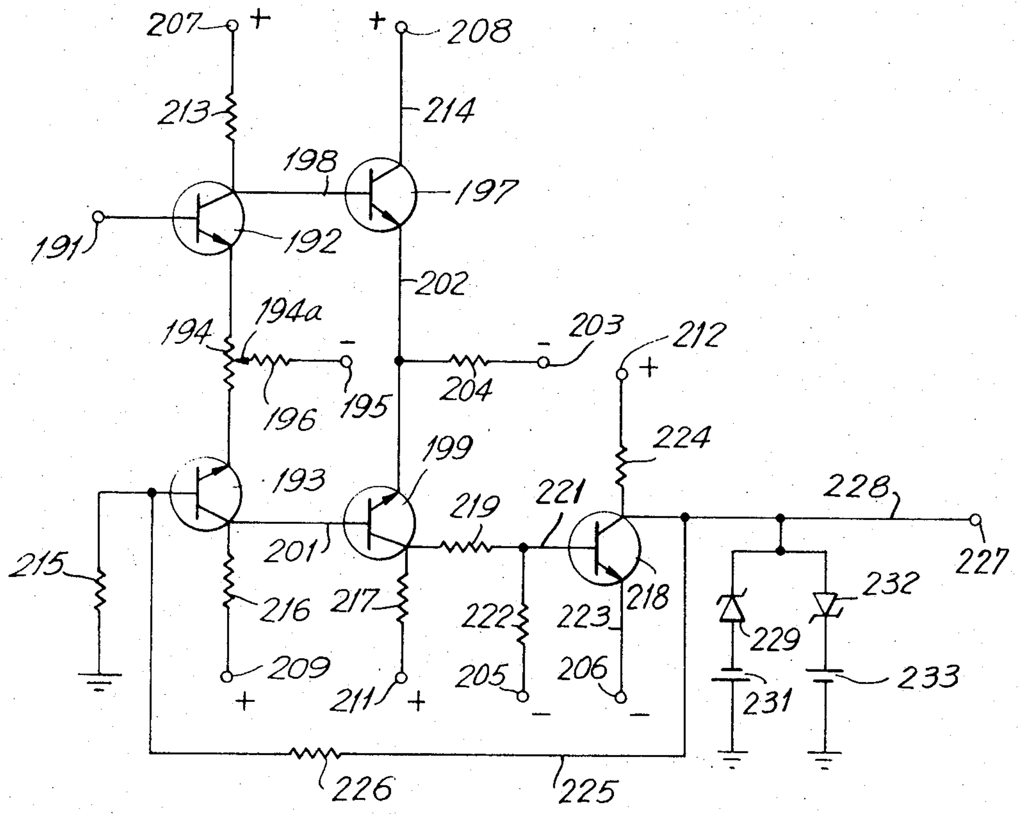
FIG. 10 is a circuit diagram of a saturation amplifier which may be utilized in the embodiment of FIG. 9.

FIG. 10 illustrates a saturation amplifier which may be utilized as the saturation amplifier 173 of the embodiment of FIG. 9. In FIG. 10, the input analog signal is supplied via an input terminal 191 to the base electrode of a first transistor 192. The emitter electrode of the first transistor 192 is connected to the emitter electrode of a second transistor 193 via a variable resistor 194. The movable terminal 194*a* of the variable resistor 194 is connected to an input terminal 195 via a resistor 196. The collector electrode of the first transistor 192 is connected to the base electrode of a third transistor via a lead 198. The collector electrode of the second transistor 193 is connected to the base electrode of a fourth transistor 199 via a lead 201.

The emitter electrodes of the third and fourth transistors 197 and 198 are connected to each other via a lead 202. A common point in the lead 202 connecting the emitters of the third and fourth transistors 197 and 199 is connected to the input terminal 203 via a lead 204. The saturation amplifier of FIG. 10 is operated by negative bias voltages applied to the input terminals 195 and 203 and to input terminals 205 and 206, as well as positive bias voltages applied to input terminals 207, 208, 209, 211 and 212. The bias voltages may be provided by any suitable source of DC voltage.

The input terminal 207 is connected to the collector electrode of the first transistor 192 via a resistor 213. The input terminal 208 is connected to the collector electrode of third transistor 197 via a lead 214. The base electrode of the second transistor 193 is connected to a point at ground potential via a resistor 215. The collector electrode of the second transistor 193 is connected to the input terminal 209 via a resistor 216. The collector electrode of the fourth transistor 199 is connected to the input terminal 211 via resistor 217. The collector electrode of the fourth transistor 199 is connected to the base electrode of a fifth transistor 218 via a resistor 219 and a lead 221. The base electrode of the fifth transistor 218 is connected to the input terminal 205 via a resistor 222. The emitter electrode of the fifth transistor 218 is connected to the terminal 206 via a lead 223. The collector electrode of the fifth transistor 218 is connected to the input terminal 212 via a resistor 224.

The collector electrode of the fifth transistor 218 is connected to the base electrode of the second transistor 193 via a feedback loop 225 which includes a feedback resistor 226. An output terminal 227 is connected to the collector electrode of the fifth transistor 218 via a lead 228. The lead 228 is connected to points at ground potential via a first branch, which comprises a Zener diode 229 connected in series with a first voltage source 231, and a second branch comprising a second Zener diode 232 connected in series with a second voltage source 233. The conductivity connection of the Zener diode and the polarity of the voltage source of the first branch are opposite to those of the second branch.

In FIG. 10, each of the first to fifth transistors 192, 193, 197, 199 and 218, respectively, is of NPN type. The feedback loop provides a large gain and the designated value of $\pm Vm/2$ volts is provided by the adjustment of the first and second Zener diodes 229 and 232. The gain of the saturation amplifier of FIG. 10 must be large enough to ensure that even when the voltage of the input analog signal is very small such as, for example, near zero, the output signal is sufficiently saturated. The values of the saturation levels are required to have very high precision. The embodiment of FIG. 9 of the present invention is not as desirable as the embodiment of FIG. 3 of the present invention, since the embodiment of FIG. 9 requires an amplifier of wide bandwidth and high gain in order to provide high precision and high speed in the coding operation. The embodiment of FIG. 3 is more desirable, since it is of simpler circuit structure. The embodiment of FIG. 9 may be utilized in a coder wherein neither very high precision nor very high speed is desired. The same modification which may be made in the embodiment of FIG. 3 may also be made in the embodiment of FIG. 9.

FIG. 11 illustrates another embodiment of the analog to digital converter coder of the present invention. The embodiment of FIG. 11 functions as a 9-bit coder. The first, second, eighth and ninth stages are indicated in FIG. 11 with the remaining intermediate stages omitted in order to maintain the clarity of illustration. In FIG. 11, a pulse amplitude modulated for PAM signal is supplied to a pair of input terminals 241 and 242. The input terminal 242 is connected to a point at ground potential. The input terminal 241 is connected to an input of a first saturation amplifier 243 via a lead 244 and to an input of a first summing amplifier 245 via a lead 246. The first saturation amplifier 243 provides an output signal in a lead 247, which is connected to the input of a first pulse generator 248 via a lead 249 and to an input of a second saturation amplifier 251 via a lead 252. The output signal of the first saturation amplifier 243 is also supplied to an input of a second summing amplifier 253 via the lead 247 and a lead 254. The output of the first summing amplifier 245 is provided in a lead 255 and is supplied to another input of the second saturation amplifier 251 via the lead 255 and a lead 256 and to another input of the second summing amplifier 253 via the lead 255 and a lead 257.

The output signal provided by the second saturation amplifier 251 is supplied via a lead 258 and a lead 259 to a second pulse generator 261 and is also supplied to an input of the third saturation amplifier (not shown in FIG. 11) of the third stage (not shown in FIG. 11) via the lead 258 and a lead 262. The output of the second summing amplifier 253 is provided in a lead 263 and is supplied to another input of the third summing amplifier via the lead 263 and a lead 264. The output of the second summing amplifier 253 is also supplied to an input of the third summing amplifier (not shown in FIG. 11) via the lead 263 and a lead 265. The output of the second saturation amplifier 251 is supplied to another input of the third summing amplifier via the lead 258 and a lead 266. The output of the first pulse generator 248 is provided at an output terminal 267 and constitutes a first binary code output signal. The output of the second pulse generator 261 is provided at an output terminal 268 and constitutes a second binary code output signal.

It is thus seen that each of the stages of the embodiment of FIG. 11 comprises a situation amplifier, a summing amplifier and a pulse generator. Each of these units is the same as, and functions, in the same manner as, the corresponding components of the embodiment of FIG. 9. Furthermore, each of the components of each nine stages functions in a manner similar to the corresponding components of the others of said stages.

In FIG. 11, each of the summing amplifiers has a gain of 2. Each of the saturation amplifiers may comprise a summing amplifier. Each of the saturation amplifiers has saturation levels of $+Vm$ volts and $-Vm$ volts and also functions as phase inverter. In each of the second to ninth stages, the output signal of each of the summing amplifiers and saturation amplifiers is supplied separately to the next succeeding summing amplifier and saturation amplifier, and the saturation level of $\pm Vm$ volts is doubled by amplification. The embodiment of FIG. 11 functions satisfactorily when each of the summing amplifiers provides essentially the same delay time as each of the saturation amplifiers. When the delay time of the summing amplifiers and the saturation amplifiers is different, however, a delay circuit must be utilized in each stage to provide the necessary delay time in the input of the amplifier which provides the lesser delay. The in embodiment of FIG. 11, either the summing amplifier or the saturation amplifier of each stage may function as a phase inverter with the other of said summing amplifier and saturation amplifier functioning as a non-phase inverter. In such case, it is necessary that the even numbered stages such as, for example, the second, fourth, sixth and eighth stages transmit complementary code pulses to their code output terminals. No further modification is necessary in the embodiment of FIG. 11.

The analog to digital converter coder of the present invention may be utilized to provide binary coding. Coding at higher speeds may be provided by overcoming the aforementioned defect of the conventional travelling wave type coder, said defect being that the distortion of the increasing part of the pulse increases further as the number of stages increases, since the distortions are cumulative. A solution to the problem is to produce the number of stages of the converter coder of the present invention by providing multinary coding. The analog to digital converter coder of the present invention is illustrated in the embodiment of FIG. 12 may be utilized to provide multinary coding.

FIG. 12 illustrates still another embodiment of the analog to digital converter coder of the present invention. In FIG. 12, an input analog signal is supplied via an input terminal 271. The terminal 271 is connected to an input of a first comparator 272 via a lead 273 and to an input of a second comparator 274 via the lead 273 and a lead 275. A first reference signal is supplied to another input of the first comparator 272 via an input terminal 276 and a second reference signal is supplied to another input of the second comparator 274 via a second input terminal 277. The first and second reference signals are different from each other. The input analog signal is also supplied to the input of a delay circuit 278 via a lead 279.

The first comparator 272 compares the input analog signal with the first reference signal in amplitude and provides an output signal which is determined by the level of said input signal relative to said first reference signal. The output signal of the first comparator 272 is provided in a lead 281. The second comparator 274 functions in the same manner as the first comparator 272 by comparing the input analog signal with the second reference signal in amplitude and providing an input signal in a lead 282 which is determined by the level of said input signal relative to said second reference signal. The output signal of the first comparator 272 is supplied to the input of a first pulse generator 283 via the lead 281 and a lead 284. The output signal of the second comparator 274 is supplied to the input of a second pulse generator 285 via the lead 282 and a lead 286.

The first pulse generator 283 shapes the waveshape of the output signal of the first pulse generator 283 and provides a digital code output signal and an output terminal 287. The second pulse generator 288 shapes the waveshape of the output signal of the second comparator 274 and provides a digital code output signal at an output terminal 288. A first bias voltage source comprises a first bistable multivibrator 289 having an input connected to the output of the first comparator 272 via the lead 281 and a lead 291, and a first polarity inverter 292 having an input connected to the output of said bistable multivibrator. The output of the first polarity inverter 292 is connected to an input of a summing amplifier 293 via a lead 294. A second bias voltage source comprises a second bistable multivibrator 295 having an intput connected to the output of the second comparator 274 via the lead 282 and a lead 296 and an output connected to the input of a second polarity inverter 297. The output of the second polarity inverter 297 is connected to another input of the summing amplifier 293 via a lead 298.

Bias voltages are supplied via an input terminal 299 to inputs of each of the first polarity inverter 292 and the second polarity inverter 297. A reset signal is supplied to an input of each of the first bistable multivibrator 289 and the second bistable multivibrator 295 via an input terminal 301. Each of the first and second bias voltage sources functions in the same manner as and comprises the same components as the bias voltage source 29 of the embodiment of FIG. 3, that is, each of the first and second bias voltage sources of the embodiment of FIG. 12 provides positive and negative bias voltage signals corresponding to the output signal of the corresponding one of the first and second comparators 272 and 274, respectively. The delay circuit 278 delays the input analog signal to an extent whereby said input analog signal is in phase with the bias voltage signals provided by the first and second polarity inverters 292 and 297. The time delayed output signal provided by the delay circuit 278 is supplied to another input of the summing amplifier 293 via a lead 302.

The summing amplifier 293 adds the bias voltage signals in the leads 294 and 298 from the first and second polarity inverters 292 and 297, respectively, and the delayed input signal in the lead 302 to provide a resultant signal in its output. The resultant output signal provided by the summing amplifier is supplied to the input of an amplifier 303 via a lead 304. An output terminal 305 is connected to the output of the amplifier 303. Each of the components of the embodiment of FIG. 12 is the same as the corresponding components of the embodiment of FIG. 3 and functions in the same manner. The principal distinction between the components of FIGS. 12 and 3 is that the embodiment of FIG. 12 functions as a ternary coder.

The gain of the amplifier 303 is such that the overall gain of the converter coder is 3. If the overload level of the converter coder of the embodiment of FIG. 12 is $+Vm$ volts, the first reference voltage, supplied to the first comparator 272, is $+Vm/3$ volts and the second reference voltage, supplied to the second comparator 274, is $-Vm/3$ volts. The digital code output signals provided at the output terminals 287 and 288 are not ternary code signals, but may be readily converted into ternary code signals by supplying said digital code output signals to a logical circuit which converts them to ternary code signals.

Due to the operation of the first and second bias voltage sources, the voltage supplied via the lead 294 to the summing amplifier 293 is $-Vm/3$ volts when the input analog signal has an amplitude greater than $+Vm/3$ volts, and the voltage supplied via said lead to said summing amplifier is $+Vm/3$ volts when said input analog signal has an amplitude which is less than $+Vm/3$ volts. The voltage applied to the summing amplifier 293 via the lead 298 is $-Vm/3$ volts when the input analog signal has an amplitude greater than $-Vm/3$ volts and the voltage applied to said summing amplifier via said lead is $+Vm/3$ volts when the amplifier of the input analog signal is less than $-Vm/3$ volts.

The voltage applied to the summing amplifier 293 via the leads 294, 298 and 302 are added by the summing amplifier 293 and the resultant output signal of said summing amplifier is tripled by the amplifier 303. The tripled output signal is then provided at the output terminal 305. Although ternary coding is provided by the embodiment of FIG. 12, said embodiment may provide multinary coding, if additional circuitry is provided. The basic principle of the circuitry an its operation, however, is the same regardless of the code provided. The embodiment of FIG. 12 may be modified in the same manner as may be the embodiment of FIG. 3.

Although the converter coder of the present invention has been described with emphasis on its desirable qualities of providing high precision and high speed coding, high speed is not essential in some telemetering systems. If high precision, but low speed, coding is desired, it is not necessary that a high speed electronic switch be utilized as the switching circuit of the converter coder of the present invention. Thus, an electromagnetic switch such as, for example, an electromagnetic relay may be substituted for the bistable multivibrator. Although the utilization of an electromagnetic relay may produce the speed of operation, it enhances the precision of operation.

Each embodiment of the converter coder of the present invention is connected in cascade arrangement with others of the the same embodiment, so that each coding system comprises a plurality of converter coders of the present invention connected in cascade. Therefore, each converter coder hereinbefore described may be utilized in the form of a printed circuit, an integrated circuit or a module or micromodule.

While the invention has been described by means of specific examples and in specific embodiments, we do not wish to be limited thereto, for obvious modifications will occur to those skilled in the art without departing from the spirit and scope of the invention.

We claim:

1. An analog to digital converter coder comprising:
input means for providing an input analog signal;
saturation amplifier means having an input connected to said input means and an output for providing positive and negative saturated output signals corresponding to said input signal;
pulse generating means having an input connected to the output of said saturation amplifier means and an output for shaping the waveshape of the output signal of said saturation amplifier means;
code output means connected to the output of said pulse generating means for providing a digital output signal;
delay means having an input connected to said input means and an output for delaying said input signal so that said input signal is in phase with the output signal of said saturation amplifier means; and
summing means having an input connected to the output of said saturation amplifier means, an input connected to the output of said delay means and an output for adding the output signal of said saturation amplifier means and the delayed input signal to provide a resultant signal.

2. An analog to digital converter coder as claimed in claim 1, further comprising amplifying means having an input connected to the output of said summing means and an output for amplifying the resultant signal provided by said summing means.

3. An analog to digital converter coder as claimed in claim 1, wherein said saturation amplifier means has a saturation level $+Vm/2$ and a saturation level $-Vm/2$, wherein $Vm$ is the overload voltage of said coder.

4. An analog to digital converter coder as claimed in claim 2, wherein said saturation amplifier means comprises a phase inverting amplifier and said amplifying means comprises a non-phase inverting amplifier.

5. An analog to digital converter coder as claimed in claim 2, wherein said saturation amplifier means comprises a non-phase inverting amplifier and said amplifying means comprises a phase inverting amplifier.

6. An analog to digital converter coder as claimed in claim 2, wherein said amplifying means has a gain of 2 and said saturation amplifier means has a saturation level $+Vm$ and a saturation level $-Vm$, wherein $Vm$ is the overload voltage of said coder.

7. An analog to digital converter coder, comprising:
input means for providing an input analog signal;
reference means for providing different first and second reference signals;
a plurality of comparator means each having an output and inputs connected to said input means and said reference means for comparing said input signal with one of said reference signals, each of said comparator means providing an output signal determined by the level of said input signal relative to the corresponding one of said reference signals;
a plurality of pulse generating means each having an input connected to the output of a corresponding one of comparator means and an output for shaping the waveshape of the output signal of the corresponding one of said comparator means;
a plurality of code output means each connected to the output of a corresponding one of said pulse generating means for providing a digital output signal;
a plurality of bias voltage means each having an input connected to the output of a corresponding one of said comparator means and an output for providing positive and negative bias voltage signals corresponding to the output signal of the corresponding one of said comparator means;
delay means having an input connected to said input means and an output for delaying said input signal so that said input signal is in phase with said bias voltage signals; and
summing means having inputs connected to the outputs of each of said bias voltage means, an input connected to the output of said delay means and an output for adding said bias voltage signals and the delayed input signal to provide a resultant signal.

8. An analog to digital converter coder as claimed in claim 7, further comprising amplifying means having an input connected to the output of said summing means and an output for amplifying the resultant signal provided by said summing means.

9. An analog to digital converter coder as claimed in claim 8, wherein said amplifying means has a gain of greater than 3.

References Cited

UNITED STATES PATENTS 3,259,896 7/1966 Pan ............... 340—347

MAYNARD R. WILBUR, Primary Examiner

C. D. MILLER, Assistant Examiner